United States Patent
Midha et al.

(10) Patent No.: US 11,323,131 B2
(45) Date of Patent: May 3, 2022

(54) DELAY-BASED SPREAD SPECTRUM CLOCK GENERATOR CIRCUIT

(71) Applicant: STMicroelectronics International N.V., Geneva (CH)

(72) Inventors: Gagan Midha, Panipat (IN); Kallol Chatterjee, Kolkata (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/089,090

(22) Filed: Nov. 4, 2020

(65) Prior Publication Data

US 2021/0135681 A1 May 6, 2021

Related U.S. Application Data

(60) Provisional application No. 62/931,441, filed on Nov. 6, 2019.

(51) Int. Cl.
*H03M 3/00* (2006.01)
*H03K 7/08* (2006.01)

(52) U.S. Cl.
CPC ............ *H03M 3/35* (2013.01); *H03K 7/08* (2013.01); *H03M 3/346* (2013.01); *H03M 3/37* (2013.01)

(58) Field of Classification Search
CPC .......... H03M 3/35; H03M 3/37; H03M 3/346; H03M 7/3022; H03K 7/08
USPC ...................................................... 341/143
See application file for complete search history.

(56) References Cited

U.S. PATENT DOCUMENTS

| | | |
|---|---|---|
| 6,940,892 B2 | 9/2005 | Bo et al. |
| 7,323,916 B1 | 1/2008 | Sidiropoulos et al. |
| 7,432,750 B1 | 10/2008 | Sidiropoulos et al. |
| 7,620,094 B2 | 11/2009 | Yoneda |
| 7,742,552 B1 | 6/2010 | Hattori |
| 7,940,098 B1 * | 5/2011 | Kwasniewski ........... H03L 7/23 327/158 |
| 8,106,687 B2 * | 1/2012 | Chang ..................... H03K 3/84 327/131 |
| 8,259,774 B2 * | 9/2012 | Chan ...................... H04B 15/04 375/130 |
| 8,320,428 B1 | 11/2012 | Hattori |
| 8,400,197 B2 * | 3/2013 | Romano .................. H03L 7/16 327/156 |
| 9,525,457 B1 | 12/2016 | Tucker et al. |
| 9,813,068 B2 | 11/2017 | Iwasaki |
| 10,348,314 B2 | 7/2019 | Kumar et al. |

* cited by examiner

*Primary Examiner* — Khai M Nguyen
(74) *Attorney, Agent, or Firm* — Crowe & Dunlevy

(57) ABSTRACT

A delay chain circuit with series coupled delay elements receives a reference clock signal and outputs phase-shifted clock signals. A multiplexer circuit receives the phase-shifted clock signals and selects among the phase-shifted clock signals for output as in response to a selection signal. The selection signal is generated by a control circuit from a periodic signal having a triangular wave profile. A sigma-delta modulator converts the periodic signal to a digital signal, and an integrator circuit integrates the digital signal to output the selection signal. The selected phase-shifted clock signal is applied as the reference signal to a phase locked loop which generates a spread spectrum clock signal.

70 Claims, 6 Drawing Sheets

DELAY-BASED SPREAD SPECTRUM CLOCK GENERATOR CIRCUIT

CROSS REFERENCE TO RELATED APPLICATION

This application claims priority from United States Provisional Application for Patent No. 62/931,441 filed Nov. 6, 2019, the disclosure of which is incorporated by reference.

TECHNICAL FIELD

The present invention relates to the field of spread spectrum clock generation and, in particular, to a delay-based spread spectrum clock generator circuit.

BACKGROUND

System on Chip (SoC) type integrated circuits typically include a digital circuit that operates in response to a clock signal. The evolution of SoC digital circuit designs requires increasing the frequency of the clock signal. However, as the operating frequency of the clock signal increases, the electromagnetic interference (EMI) also increases. This EMI can be a significant concern, especially in consumer electronics, with microprocessor-based systems and data transmission circuits. Reduction of EMI is therefore a critical design feature.

There are a number of known EMI reduction schemes including: the use of a shielding box, skew-rate control circuits and spread spectrum clock generation. Of these options, spread spectrum clock generation is an attractive solution because of its lower hardware cost. As a result, a spread spectrum clock generation circuit is a common component of many SoC designs.

SUMMARY

In an embodiment, a circuit comprises: a delay chain circuit having an input configured to receive a reference clock signal, the delay chain circuit including a plurality of delay elements coupled in series, wherein the delay chain circuit outputs a plurality of phase-shifted clock signals; a first multiplexer circuit having inputs coupled to receive the plurality of phase-shifted clock signals and having a first selection input configured to receive a first selection signal which selects one of the plurality of phase-shifted clock signals for output; and a control circuit configured to generate values for the first selection signal from a waveform signal having a periodic triangular wave profile, wherein the control circuit includes: a sigma-delta modulator configured to convert the waveform signal to generate a modulated digital signal from which the values for the first selection signal are generated.

In an embodiment, a method comprises: selecting one of a plurality of phase-shifted clock signals for output in response to a selection signal; generating values for the selection signal by performing sigma-delta modulation of a waveform signal having a periodic triangular wave profile; and processing the selecting one of the plurality of phase-shifted clock signals to output a spread spectrum clock signal.

DETAILED DESCRIPTION

Figure 1:
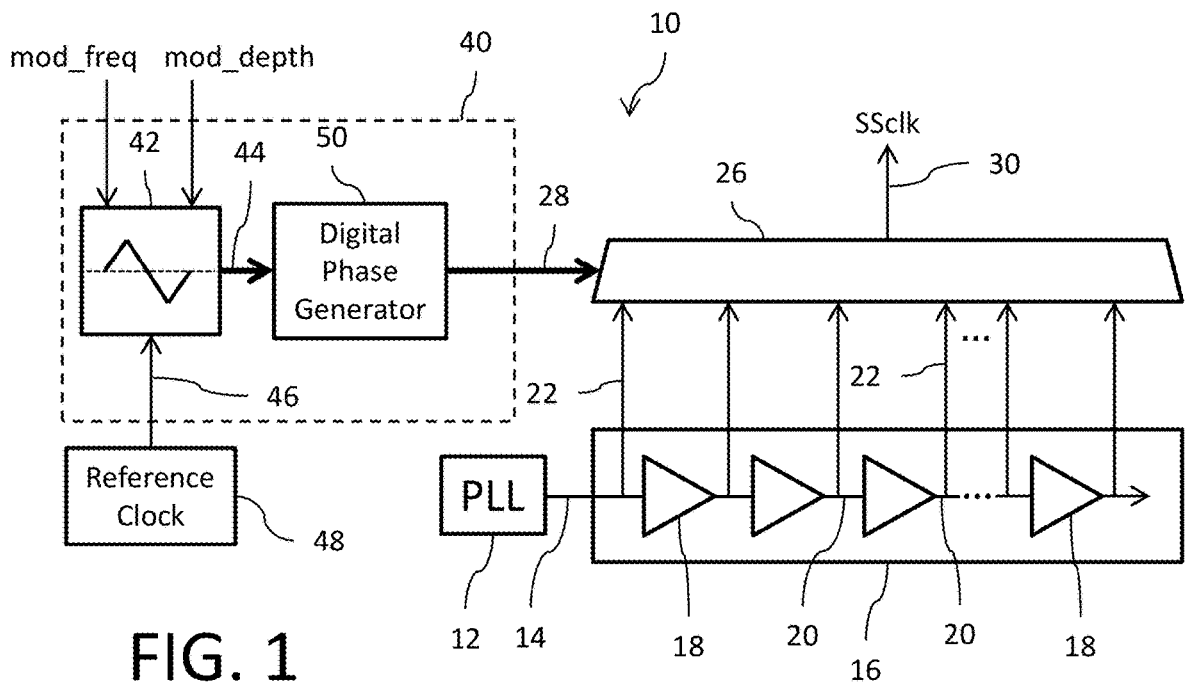
FIG. 1-3 show block diagrams for embodiments of a spread spectrum clock generator circuit.

Reference is now made to FIG. 1 which shows a block diagram for an embodiment of a spread spectrum clock generator circuit 10. The circuit 10 includes a phase lock loop (PLL) circuit 12 configured to generate a clock signal 14 oscillating at a frequency fclk. The clock signal 14 is input to a delay chain circuit 16 that includes a plurality of delay elements 18 (for example, signal buffer circuits) of identical construction and designed to provide identical delays. The delay elements 18 are coupled in series with each other, with the delay chain circuit 16 including a plurality of taps 20, wherein each tap 20 outputs a phase shifted clock signal 22 oscillating at the frequency fclk but having a different phase shift. The plurality of phase shifted clock signals 22 are applied to the inputs of a multiplexer circuit 26. The selection input of the multiplexer circuit 26 receives a digital multiplexer control signal 28 and the multiplexer circuit 26 operates in response to the values of the digital multiplexer control signal 28 to select one of the phase shifted clock signals 22 for output as a spread spectrum clock signal (SSclk) 30.

The multiplexer control signal 28 is generated by a control circuit 40. The control circuit 40 includes a digital waveform generator circuit 42 that outputs a digital signal 44 whose values define a periodic signal having a triangular wave profile defined by a modulation depth parameter (mod_depth) and a modulation frequency parameter (mod_freq) and which is generated in response to a reference clock signal 46 output by a reference clock generator circuit 48. The frequency fref of the reference clock signal 46 is substantially less than the frequency fclk of the clock signal 14. A phase generator 50 receives the triangular wave profile digital signal 44 and generates the digital multiplexer control signal 28. The phase generator 50 may, for example, comprise a digital integrator circuit (such as an accumulator with a transfer function $$\frac{1}{(1-z^{-1})}).$$

Figure 2:
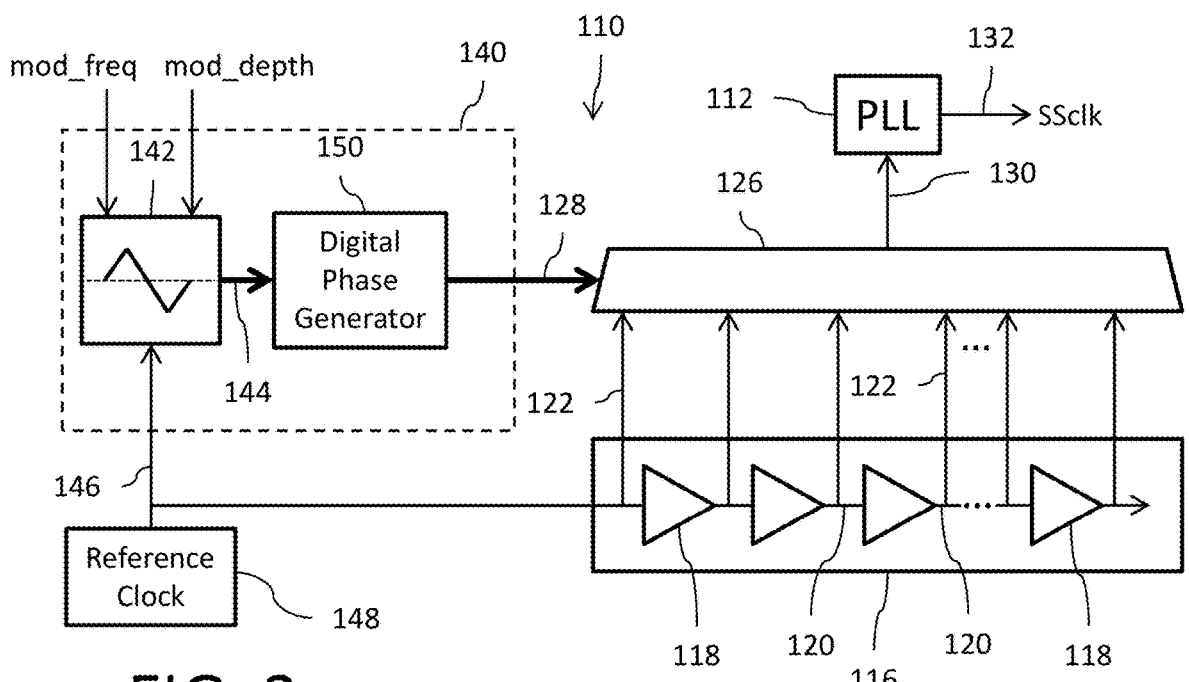

Reference is now made to FIG. 2 which shows a block diagram for an embodiment of a spread spectrum clock generator circuit 110. The circuit 110 includes a reference clock generator 148 that generates a reference clock signal 146 oscillating at a frequency fref. The reference clock signal 146 is input to a delay chain circuit 116 that includes a plurality of delay elements 118 (for example, signal buffer circuits) of identical construction and designed to provide identical delays. The delay elements 118 are coupled in series with each other, with the delay chain circuit 116 including a plurality of taps 120, wherein each tap 120 outputs a phase shifted clock signal 122 oscillating at the frequency fref but having a different phase shift. The plurality of phase shifted clock signals 122 are applied to the inputs of a multiplexer circuit 126. The selection input of the multiplexer circuit 126 receives a digital multiplexer control signal 128 and the multiplexer circuit 126 operates in response to the values of the digital multiplexer control signal 128 to select one of the phase shifted clock signals 122 for output as an input spread spectrum clock signal 130. The input spread spectrum clock signal 130 is applied as the reference clock signal to a phase lock loop (PLL) circuit 112 that generates an output spread spectrum clock signal 132 oscillating at a frequency fclk (where the frequency fclk is substantially greater than the frequency fref).

The digital multiplexer control signal 128 is generated by a control circuit 140. The control circuit 140 includes a digital waveform generator circuit 142 that outputs a digital signal 44 whose values define a periodic signal having a triangular wave profile defined by a modulation depth parameter (mod_depth) and a modulation frequency parameter (mod_freq) and which is generated in response to the reference clock signal 146 output by the reference clock generator circuit 148. A phase generator 150 receives the values of the triangular wave profile digital signal 144 and generates the digital multiplexer control signal 128. The phase generator 150 may, for example, comprise a digital integrator circuit (such as an accumulator with a transfer function of $$\frac{1}{(1-z^{-1})}).$$

The circuit 110 possesses a number of advantages over the circuit 10 in terms of a lower buffer delay and reduced power consumption. However, both circuit 10 and circuit 110 suffer from a common drawback in terms of a requirement for an excessively high number of delay elements 18, 118 within the delay chain circuit 16, 116. Consider, for example, a reference frequency fref of 10e^6, a modulation frequency of 50e^3 and a modulation depth of 1% peak; so there is a period of 100 ns with a modulation depth of 1 ns Peak. The reference frequency divided by the modulation frequency is 200. The phase movement in the spread spectrum clock generator is given by: (0.5)*(1 ns)*100=50. The delay value (in each buffer) for a 5% error tolerance in profile is equal to 5/100*1 ns=50 ps. With this, the number of delay elements 18, 118 required in the delay chain circuit 16, 116 for the phase movement is 50 ns/50 ps=1000.

Figure 3:
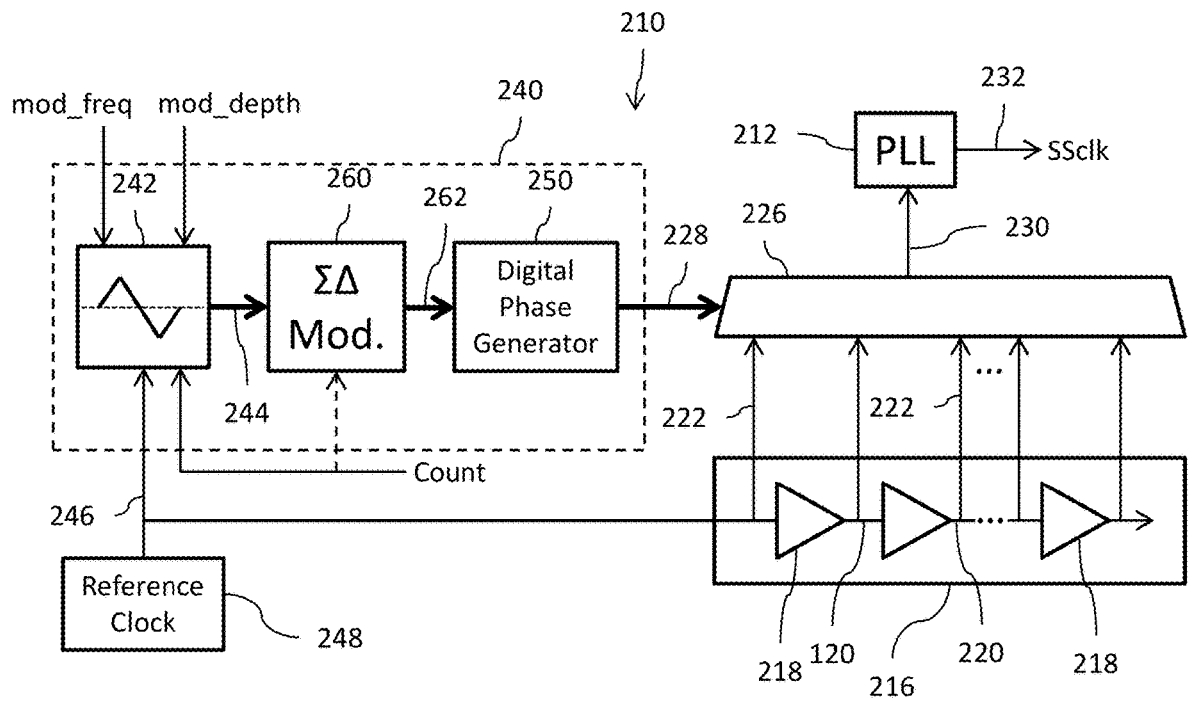

Reference is now made to FIG. 3 which shows a block diagram for an embodiment of a spread spectrum clock generator circuit 210. The circuit 210 includes a reference clock generator 248 that generates a reference clock signal 246 oscillating at a frequency fref. The reference clock signal 246 is input to a delay chain circuit 216 that includes a plurality of delay elements 218 (for example, signal buffer circuits) of identical construction and designed to provide identical delays. The delay elements 218 are coupled in series with each other, with the delay chain circuit 216 including a plurality of taps 220, wherein each tap 220 outputs a phase shifted clock signal 222 oscillating at the frequency fref but having a different phase shift. The plurality of phase shifted clock signals 222 are applied to the inputs of a multiplexer circuit 226. The selection input of the multiplexer circuit 226 receives a digital multiplexer control signal 228 and the multiplexer circuit 226 operates in response to values of the digital multiplexer control signal 228 to select one of the phase shifted clock signals 222 for output as an input spread spectrum clock signal 230. The input spread spectrum clock signal 230 is applied as the reference clock signal to a phase lock loop (PLL) circuit 212 that generates an output spread spectrum clock signal 232 oscillating at a frequency fclk (where the frequency fclk is substantially greater than the frequency fref).

The multiplexer control signal 228 is generated by a control circuit 240. The control circuit 240 includes a digital waveform generator circuit 242 that outputs a digital signal 244 whose values define a periodic signal having a triangular wave profile defined by a modulation depth parameter (mod_depth) and a modulation frequency parameter (mod_freq) and which is generated in response to the reference clock signal 246 output by the reference clock generator circuit 248. A digital sigma-delta modulator 260 receives the digital signal 144 and generates a modulated digital signal 262. In an embodiment, the sigma-delta modulator 260 is a third-order single, MASH 1-1-1 type circuit, but it will be understood that the sigma-delta modulator 260 may be of any desired order and configuration. A phase generator 250 receives the modulated digital signal 262 and generates the digital multiplexer control signal 228. The phase generator 250 may, for example, comprise a digital integrator circuit (such as an accumulator with a transfer function $$\frac{1}{(1-z^{-1})}).$$

The circuit 210 of FIG. 3 takes advantage of the fact that the PLL 212 has a low-pass transfer function. The sigma-delta modulator 260 performs noise shaping by pushing the quantization noise introduced by the modulation operation into the higher frequency domain. This noise is then filtered out by the low-pass response of the PLL. This is beneficial because an error tolerance similar to the FIG. 2 circuit can be achieved in circuit 210 with fewer delay elements. Consider, for example, a reference frequency fref of 10e^6, a modulation frequency of 50e^3, a modulation depth of 1% peak and sigma-delta modulation step of 5% (5 ns); so there is a period of 100 ns with a modulation depth of 1 ns Peak for the triangle waveform. The reference frequency divided by the modulation frequency is 200. The phase movement in the spread spectrum clock generator is given by: (0.5)*(1 ns)*100=50. So, the delay elements for phase movement with sigma-delta modulation are 50 ns/5 ns=10. The delay value (in each buffer) for a 5% error tolerance in profile is equal to 5/100*1 ns=50 ps. With this, the number of delay elements 18, 118 required in the delay chain circuit 16, 116 for the phase movement in the FIG. 3 implementation 5 ns/50 ps=100. For a similar error tolerance, this is an order of magnitude reduction in the number of delay elements used by the FIG. 3 circuit 210 in comparison to the FIG. 2 circuit 110.

Figure 4:
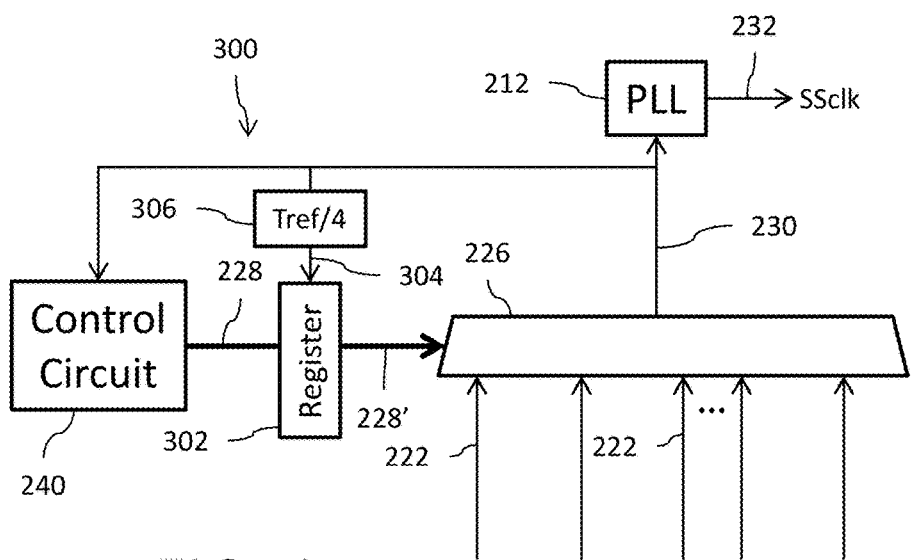
FIGS. 4-5 show block diagrams for embodiments of a clocking control circuit.
Figure 8:
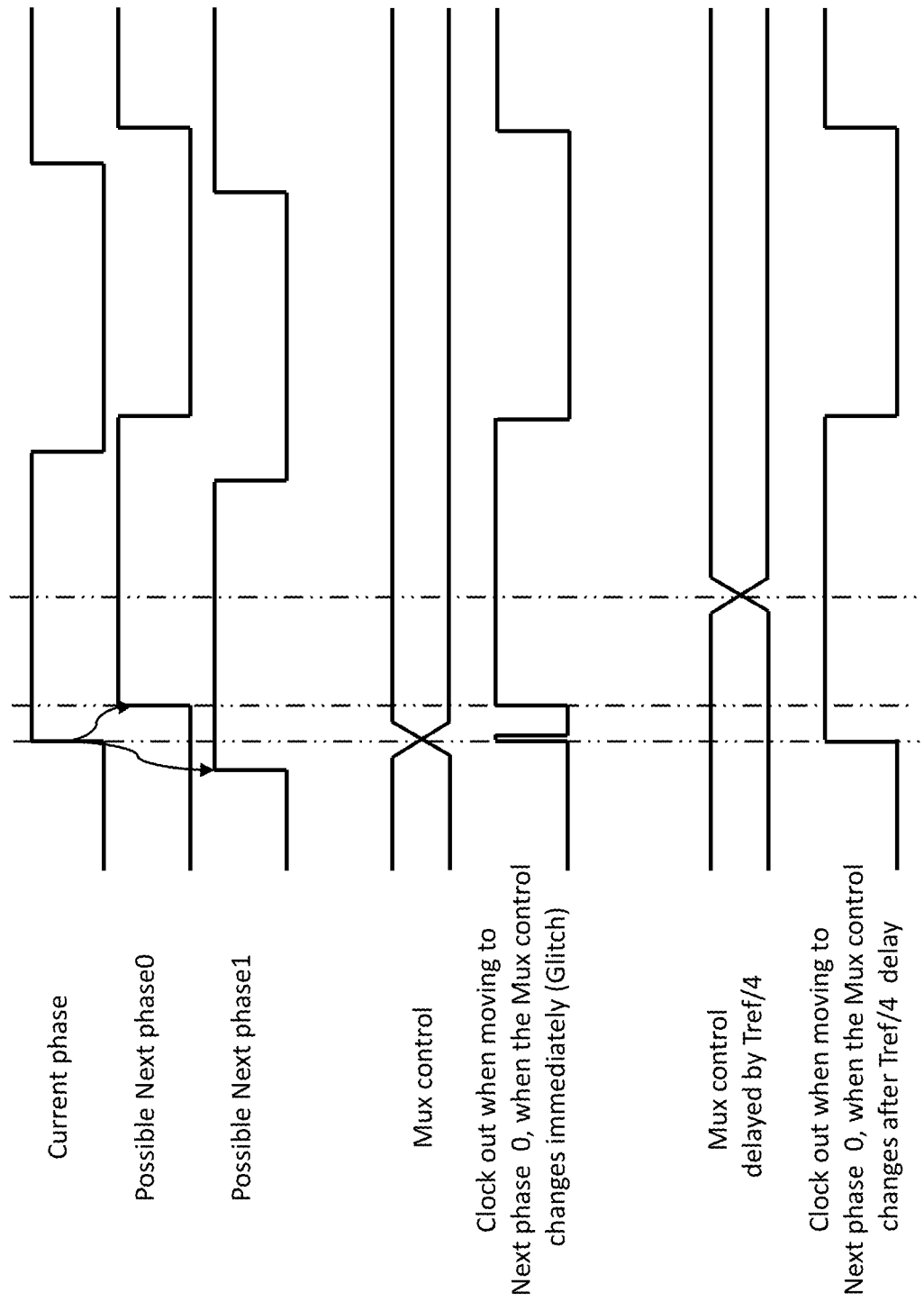
FIG. 8 shows operational timing waveforms.

Reference is now made to FIG. 4 which shows a block diagram of a clocking control circuit 300. The multiplexer control signal 228 output from the control circuit 240 is applied to the input of a multi-bit register 302 (formed, for example, by D-type flip-flops). The multi-bit register 302 is clocked by a clock signal 304 and responds to the leading edge of the clock signal 304 by latching the data values of the multiplexer control signal 228 output from the control circuit 240 for output as signal 228' to the selection input of the multiplexer circuit 226. The multi-bit register 302 controls the timing for making changes to the value of the applied multiplexer control signal 228' so that such changes occur only when the logical value of the current phase and the next phase which is going to be selected are static. This is shown by the operating waveforms in FIG. 8 where it will be noted that: at each positive edge of clock signal 230 the control circuit 240 gives the next value for the multiplexer control signal 228; but if the changed value is immediately applied to the multiplexer there is a risk that a glitch will be produced on the output clock 230; so, to avoid this concern, a delay is introduced, which is greater than the maximum phase change that can happen, and the glitch is avoided. This control operation is best achieved for the clock at time instants defined by Tref/4 and 3*Tref/4, where Tref is the clock period of the reference clock signal 246. The input spread spectrum clock signal 230 is used to clock the logic circuitry of the control circuit 240 and is further applied to the input of a delay circuit 306 which delays the input spread spectrum clock signal 230 by Tref/4 and outputs the clock signal 304.

Figure 5:
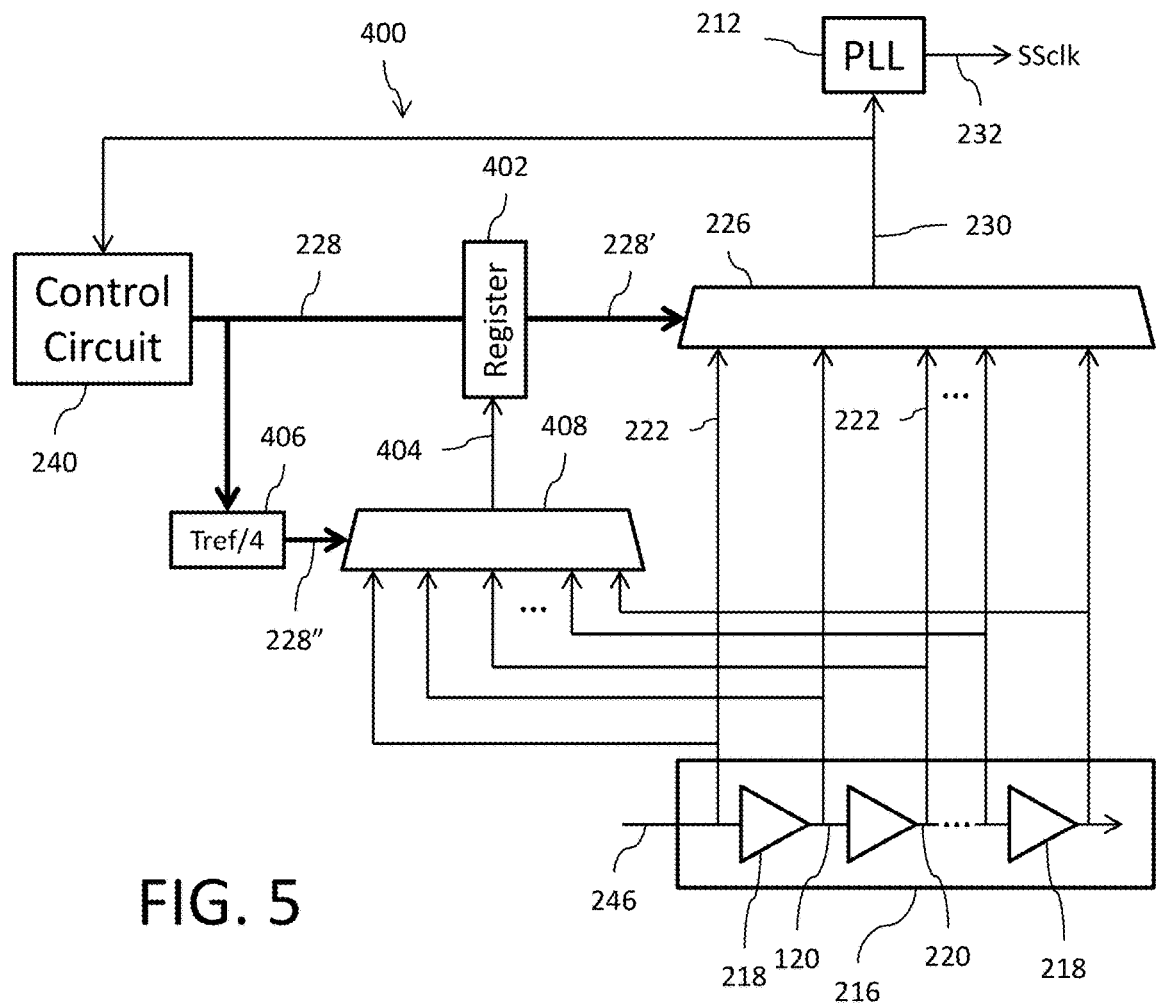

Reference is now made to FIG. 5 which shows a block diagram of a clocking control circuit 400. The multiplexer control signal 228 output from the control circuit 240 is applied to the input of a multi-bit register 402 (formed, for example, by D-type flip-flops). The multi-bit register 402 is clocked by a clock signal 404 and responds to the leading edge of the clock signal 404 by latching the data values of the multiplexer control signal 228 output from the control circuit 240 for output as signal 228' to the selection input of the multiplexer circuit 226. The multi-bit register 402 controls the timing for change in the applied multiplexer control signal 228 to occur only when the logical value of the current phase and the next phase which is going to be selected are static (see, FIG. 8). This is best achieved for the clock at time instants defined by Tref/4 and 3*Tref/4, where Tref is the clock period of the reference clock signal 246. The input spread spectrum clock signal 230 is used to clock the logic circuitry of the control circuit 240. The plurality of phase shifted clock signals 222 are applied to the inputs of a multiplexer circuit 408. The selection input of the multiplexer circuit 408 receives a delayed version (signal 228") of the multiplexer control signal 228 generated by a delay circuit 406 (which delays the multiplexer control signal 228 by Tref/4 (for example)), and the multiplexer circuit 408 operates in response to that signal 228" to select one of the phase shifted clock signals 222 for output as the clock signal 404.

Figure 6:
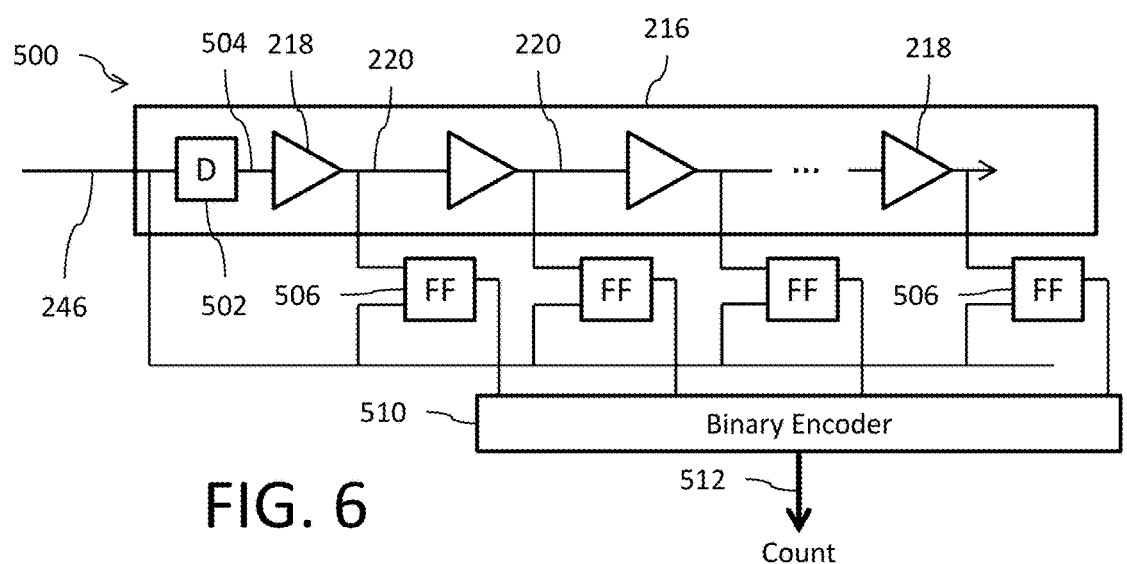
FIG. 6 is a block diagram for a calibration circuit.

With reference once again to FIG. 3, it will be noted that the length of the delay provided by each delay element 218 (for example, signal buffer circuit) in the delay chain circuit 216 is process, voltage and temperature (PVT) dependent. Because of this, the modulation depth of circuit 210 will also vary with change in process, voltage and temperature. An initial calibration can be performed to address the process and voltage variation of the buffer circuits. This calibration utilizes the circuit 500 shown in FIG. 6. Circuit 500 includes a delay element 502 configured to apply a small delay Δd to the reference clock signal 246 and generate a delayed clock signal 504 which is applied to the string of delay elements 218 in the delay chain circuit 216. A D-type flip-flop 506 is provided for each delay element 218, with the output of the delay element 218 provided to the D input of the corresponding flip-flop 506. The clock input of each flip-flop 506 receives the reference clock signal 246. The Q output of each flip-flop 506 is connected to a corresponding input of a binary encoder circuit 510. The circuit 500 operates as a timed counter circuit with the binary encoder circuit 510 functioning to count the number of delay elements 218 which change logic state within one cycle of the reference clock signal 246 and output an encoded digital count value (Count) 512 indicative of the counted number.

The encoded digital count value 512 is then applied as a further input to the signal generator circuit 242 that generates the periodic signal 244 having the triangular wave profile (and optionally or alternatively to the sigma-delta modulator 260 that generates the digital output signal 262). The value of the Count 512 is used in the signal generator circuit 242 to adjust the modulation depth (mod_depth) value by way of a simple multiplication (scaling) operation. In the alternative implementation, the value of the Count 512 is instead used in the sigma-delta modulator 260 to adjust the quantization levels. It is somewhat easier to perform the adjustment of modulation depth, and so this solution is preferable. The adjustment that is made will account for sensed differences in the Count 512 value due to process and voltage variation of the buffer circuits. For example, for Fref having a 100 ns period and where the delay provided by each delay element is 5 ns, then Count 512=20 (ideal). The quantizer level for the SDM 260 is considered to be 5 ns (always). Now, due to process variation, the delay element becomes 10 ns, Count=10 (actual). In that case the scaling factor will become actual/deal=10/20=0.5. A multiplication block (not explicitly shown) positioned between generator 242 and SDM 260 can be used.

The foregoing calibration operation does not address temperature variation. However, temperature variation is minute in circuit 210 and may in many implementations be ignored without negative impact. If temperature compensation is needed, a delay locked loop (DLL) circuit may be provided in order to keep the buffer delays locked with each other.

Figure 7A:
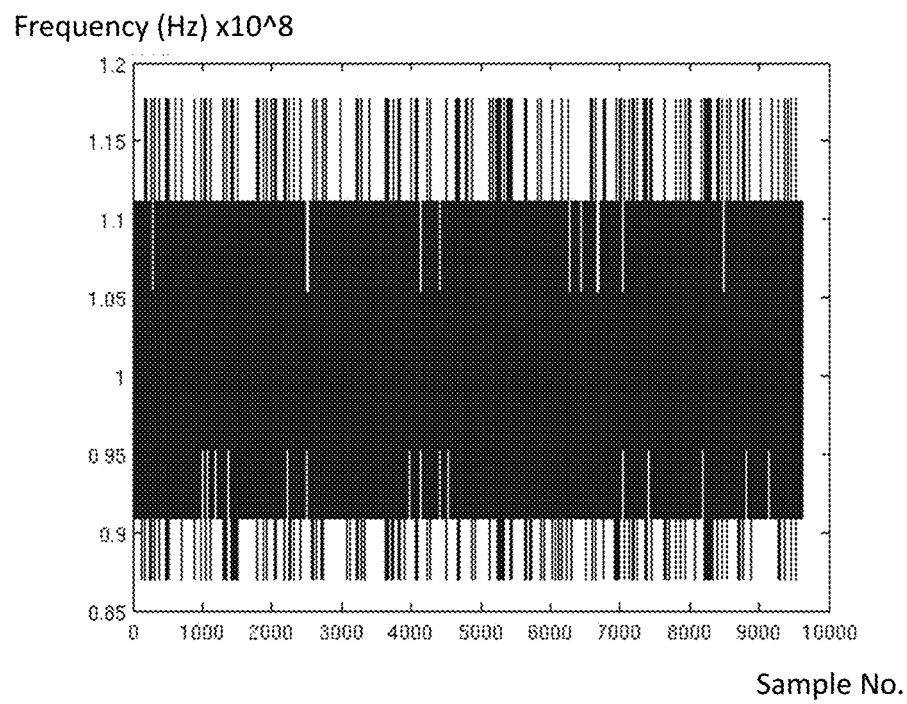
FIGS. 7A-7D are plots illustrating operation of the FIG. 3 circuit.
Figure 7B:
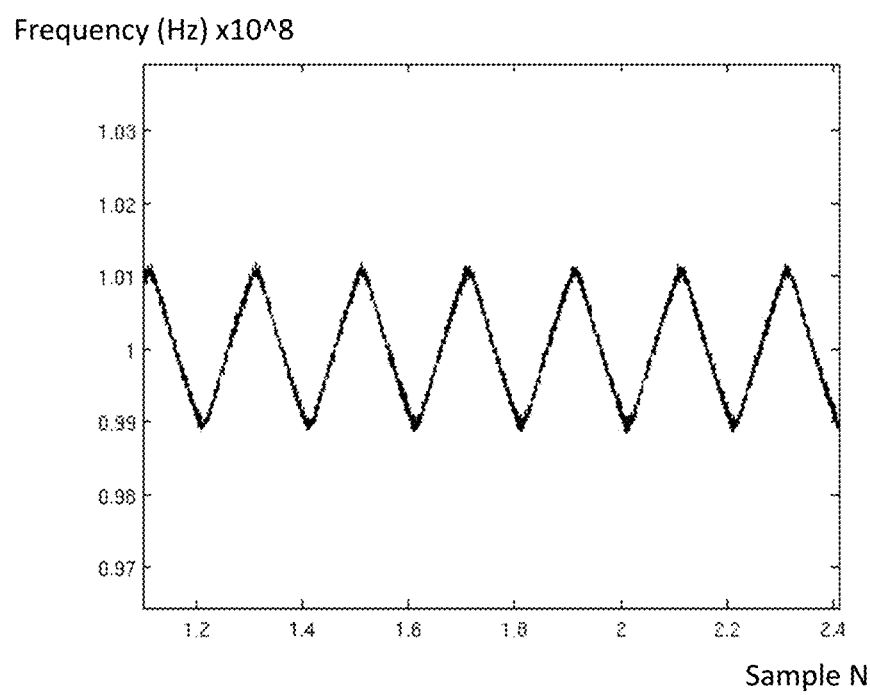
Figure 7C:
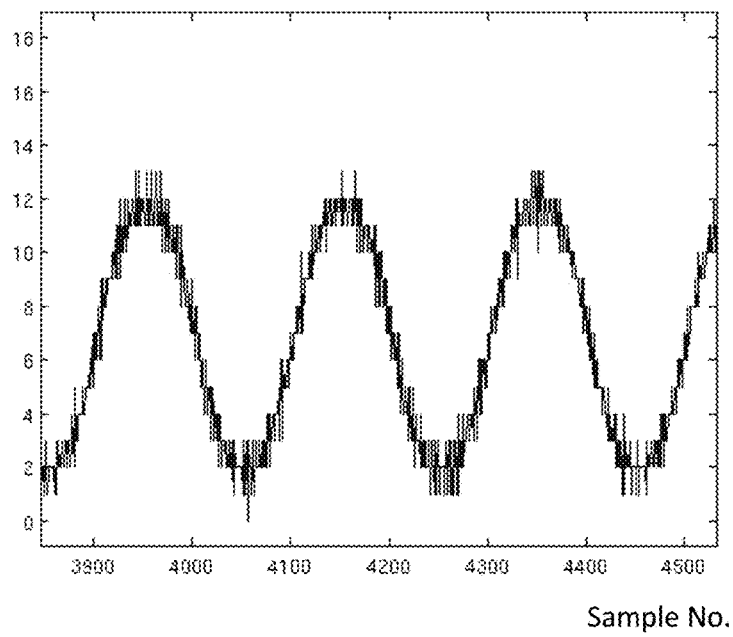
Figure 7D:
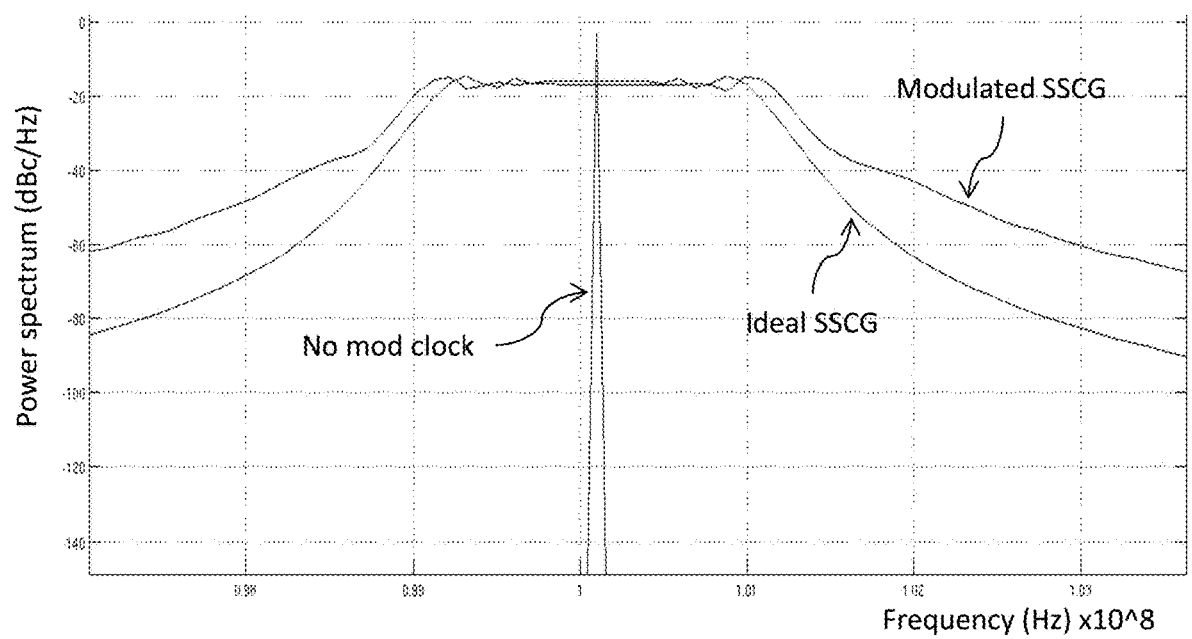

Reference is now made to FIGS. 7A-7D which show plots illustrating operation of the FIG. 3 circuit 210. FIG. 7A shows the unfiltered output clock frequency signal 230 scaled by N (which is the divisor value in the PLL 212) where the y-axis shows frequency in Hz and the x-axis shows the sample number in terms of clock cycle. FIG. 7B shows the output clock frequency of the PLL with signal 232 where the y-axis shows frequency in Hz and the x-axis shows the sample number in terms of clock cycle. FIG. 7C shows the multiplexer control for the delay chain signal 228 where the y-axis shows the value of the multiplexer selection and the x-axis shows the sample number in time (every REF cycle). FIG. 7D shows a plot of the phase noise power spectral density where the y-axis shows dBc/Hz and the x-axis shows frequency in Hz. The density plot for "No mod clock" shows the density for the case where no spread spectrum clock generation (SSCG) is performed. The density plot for "Ideal SSCG" shows the density for the case where a pure triangle waveform is used for the spread spectrum clock generation. The density plot for "Modulated SSCG" shows the density for the case where sigma-delta modulation (SDM) of the triangle waveform is used for the spread spectrum clock generation.

Although the preceding description has been described herein with reference to particular circuits and embodiments, it is not intended to be limited to the particulars disclosed herein; rather, it extends to all functionally equivalent structures, methods, and uses, such as are within the scope of the appended claims.

The invention claimed is:

1. A circuit, comprising:
   a delay chain circuit having an input configured to receive a reference clock signal, the delay chain circuit including a plurality of delay elements coupled in series, wherein the delay chain circuit outputs a plurality of phase-shifted clock signals;
   a first multiplexer circuit having inputs coupled to receive the plurality of phase-shifted clock signals and having a first selection input configured to receive a first selection signal which selects one of the plurality of phase-shifted clock signals for output; and a control circuit configured to generate values for the first selection signal from a waveform signal having a periodic triangular wave profile, wherein the control circuit includes:
  a sigma-delta modulator configured to convert the waveform signal to generate a modulated digital signal from which the values for the first selection signal are generated; and
  a register circuit configured to latch the first selection signal in response to a control clock, wherein the control clock is a delayed version of the phase-shifted clock signal selected by the first selection signal and output by the first multiplexer circuit.

2. The circuit of claim 1, further comprising a phase generator circuit configured to process the modulated digital signal and output the values of the first selection signal.

3. The circuit of claim 2, wherein the phase generator circuit comprises a digital integrator circuit.

4. The circuit of claim 1, further comprising a phase lock loop (PLL) circuit configured to receive the selected phase-shifted clock signal as a reference for generating a spread spectrum clock signal.

5. The circuit of claim 4, wherein the sigma-delta modulator implements noise shaping to push quantization noise into a higher frequency domain and the PLL circuit has a low-pass response for filtering out the quantization noise.

6. The circuit of claim 1, further comprising:
  a compensation circuit configured to determine a number of delay elements within the delay chain circuit which change state in response to one cycle of the reference clock signal; and
  wherein the control circuit adjusts a modulation depth of the waveform signal having the triangular wave profile in response to the determined number of delay elements.

7. The circuit of claim 1, further comprising:
  a compensation circuit configured to determine a number of delay elements within the delay chain circuit which change state in response to one cycle of the reference clock signal; and
  wherein the control circuit adjusts a number of quantization levels for the sigma-delta modulator in response to the determined number of delay elements.

8. The circuit of claim 1, wherein the control circuit further includes a digital waveform generator configured to generate the waveform signal having the triangular wave profile in response to the reference clock signal.

9. The circuit of claim 8, wherein the triangular wave profile is defined by a modulation frequency and a modulation depth.

10. The circuit of claim 9, wherein the modulation depth is scaled by a compensation value to account for process and voltage variation of the plurality of delay elements.

11. The circuit of claim 10, wherein the compensation value is generated dependent on a number of delay elements within the delay chain circuit which change state in response to one cycle of the reference clock signal.

12. A circuit, comprising:
  a delay chain circuit having an input configured to receive a reference clock signal, the delay chain circuit including a plurality of delay elements coupled in series, wherein the delay chain circuit outputs a plurality of phase-shifted clock signals;
  a first multiplexer circuit having inputs coupled to receive the plurality of phase-shifted clock signals and having
  a first selection input configured to receive a first selection signal which selects one of the plurality of phase-shifted clock signals for output
  a control circuit configured to generate values for the first selection signal from a waveform signal having a periodic triangular wave profile, wherein the control circuit includes:
    a sigma-delta modulator configured to convert the waveform signal to generate a modulated digital signal from which the values for the first selection signal are generated; and
    a register circuit configured to latch the first selection signal in response to a control clock, wherein the control clock is a further selected one of the plurality of phase-shifted clock signals.

13. The circuit of claim 12, further comprising a second multiplexer circuit having inputs coupled to receive the plurality of phase-shifted clock signals and having a second selection input configured to receive a second selection signal which selects said further selected one of the plurality of phase-shifted clock signals for output by the second multiplexer circuit.

14. The circuit of claim 12, wherein the second selection signal is a delayed version of the first selection signal generated by the control circuit.

15. The circuit of claim 12, further comprising a phase generator circuit configured to process the modulated digital signal and output the values of the first selection signal.

16. The circuit of claim 15, wherein the phase generator circuit comprises a digital integrator circuit.

17. The circuit of claim 12, further comprising a phase lock loop (PLL) circuit configured to receive the selected phase-shifted clock signal as a reference for generating a spread spectrum clock signal.

18. The circuit of claim 12, wherein the sigma-delta modulator implements noise shaping to push quantization noise into a higher frequency domain and the PLL circuit has a low-pass response for filtering out the quantization noise.

19. The circuit of claim 12, further comprising:
  a compensation circuit configured to determine a number of delay elements within the delay chain circuit which change state in response to one cycle of the reference clock signal; and
  wherein the control circuit adjusts a modulation depth of the waveform signal having the triangular wave profile in response to the determined number of delay elements.

20. The circuit of claim 12, further comprising:
  a compensation circuit configured to determine a number of delay elements within the delay chain circuit which change state in response to one cycle of the reference clock signal; and
  wherein the control circuit adjusts a number of quantization levels for the sigma-delta modulator in response to the determined number of delay elements.

21. The circuit of claim 13, wherein the control circuit further includes a digital waveform generator configured to generate the waveform signal having the triangular wave profile in response to the reference clock signal.

22. The circuit of claim 21, wherein the triangular wave profile is defined by a modulation frequency and a modulation depth.

23. The circuit of claim 22, wherein the modulation depth is scaled by a compensation value to account for process and voltage variation of the plurality of delay elements.

24. The circuit of claim 23, wherein the compensation value is generated dependent on a number of delay elements within the delay chain circuit which change state in response to one cycle of the reference clock signal.

25. A method, comprising:
    selecting one of a plurality of phase-shifted clock signals for output in response to a selection signal;
    generating values for the selection signal by performing sigma-delta modulation of a waveform signal having a periodic triangular wave profile;
    processing the selecting one of the plurality of phase-shifted clock signals to output a spread spectrum clock signal; and
    latching the value of the selection signal in response to a control clock, wherein the control clock is a delayed version of the selected one of the phase-shifted clock signals.

26. The method of claim 25, wherein the sigma-delta modulation generates a modulated digital signal, further comprising: phase processing the modulated digital signal to generate the values of the selection signal.

27. The method of claim 26, wherein phase processing comprises digitally integrating the modulated digital signal.

28. The method of claim 25, wherein processing comprises using the selected one of the plurality of phase-shifted clock signals as a reference clock for a phase lock loop (PLL) circuit which generates the spread spectrum clock signal.

29. The method of claim 28, wherein sigma-delta modulation implements noise shaping to push quantization noise into a higher frequency domain and wherein the PLL circuit has a low-pass response for filtering out the quantization noise.

30. The method of claim 25, further comprising:
    determining a number of delay elements within a delay chain circuit generating the plurality of phase-shifted clock signals from a reference clock signal which change state in response to one cycle of the reference clock signal; and
    adjusting a modulation depth of the waveform signal having the triangular wave profile in response to the determined number of delay elements.

31. The method of claim 25, further comprising:
    determining a number of delay elements within a delay chain circuit generating the plurality of phase-shifted clock signals from a reference clock signal which change state in response to one cycle of the reference clock signal; and
    adjusting a number of quantization levels for the sigma-delta modulation in response to the determined number of delay elements.

32. The method of claim 25, further comprising scaling a modulation depth of the waveform signal by a compensation value to account for process and voltage variation of delay elements within a delay chain circuit generating the plurality of phase-shifted clock signals.

33. The method of claim 25, further comprising adjusting a number of quantization levels for the sigma-delta modulation to account for process and voltage variation of delay elements within a delay chain circuit generating the plurality of phase-shifted clock signals.

34. A method, comprising,
    selecting one of a plurality of phase-shifted clock signals for output in response to a selection signal;
    generating values for the selection signal by performing sigma-delta modulation of a waveform signal having a periodic triangular wave profile;
    processing the selecting one of the plurality of phase-shifted clock signals to output a spread spectrum clock signal; and
    latching the value of the selection signal in response to a control clock, wherein the control clock is a further selected one of the plurality of phase-shifted clock signals.

35. The method of claim 34, further comprising selecting the further selected one of the plurality of phase-shifted clock signals in response to a delayed version of the selection signal.

36. The method of claim 34, wherein the sigma-delta modulation generates a modulated digital signal, further comprising: phase processing the modulated digital signal to generate the values of the selection signal.

37. The method of claim 36, wherein phase processing comprises digitally integrating the modulated digital signal.

38. The method of claim 34, wherein processing comprises using the selected one of the plurality of phase-shifted clock signals as a reference clock for a phase lock loop (PLL) circuit which generates the spread spectrum clock signal.

39. The method of claim 38, wherein sigma-delta modulation implements noise shaping to push quantization noise into a higher frequency domain and wherein the PLL circuit has a low-pass response for filtering out the quantization noise.

40. The method of claim 34, further comprising:
    determining a number of delay elements within a delay chain circuit generating the plurality of phase-shifted clock signals from a reference clock signal which change state in response to one cycle of the reference clock signal; and
    adjusting a modulation depth of the waveform signal having the triangular wave profile in response to the determined number of delay elements.

41. The method of claim 26, further comprising:
    determining a number of delay elements within a delay chain circuit generating the plurality of phase-shifted clock signals from a reference clock signal which change state in response to one cycle of the reference clock signal; and
    adjusting a number of quantization levels for the sigma-delta modulation in response to the determined number of delay elements.

42. The method of claim 34, further comprising scaling a modulation depth of the waveform signal by a compensation value to account for process and voltage variation of delay elements within a delay chain circuit generating the plurality of phase-shifted clock signals.

43. The method of claim 34, further comprising adjusting a number of quantization levels for the sigma-delta modulation to account for process and voltage variation of delay elements within a delay chain circuit generating the plurality of phase-shifted clock signals.

44. A circuit, comprising:
    a delay chain circuit having an input configured to receive a reference clock signal, the delay chain circuit including a plurality of delay elements coupled in series, wherein the delay chain circuit outputs a plurality of phase-shifted clock signals;
    a first multiplexer circuit having inputs coupled to receive the plurality of phase-shifted clock signals and having a first selection input configured to receive a first selection signal which selects one of the plurality of phase-shifted clock signals for output; and a control circuit configured to generate values for the first selection signal from a waveform signal having a periodic triangular wave profile, wherein the control circuit includes:
   a sigma-delta modulator configured to convert the waveform signal to generate a modulated digital signal from which the values for the first selection signal are generated;
a compensation circuit configured to determine a number of delay elements within the delay chain circuit which change state in response to one cycle of the reference clock signal; and
wherein the control circuit adjusts a modulation depth of the waveform signal having the triangular wave profile in response to the determined number of delay elements.

45. The circuit of claim 44, further comprising a phase generator circuit configured to process the modulated digital signal and output the values of the first selection signal.

46. The circuit of claim 45, wherein the phase generator circuit comprises a digital integrator circuit.

47. The circuit of claim 44, further comprising a phase lock loop (PLL) circuit configured to receive the selected phase-shifted clock signal as a reference for generating a spread spectrum clock signal.

48. The circuit of claim 47, wherein the sigma-delta modulator implements noise shaping to push quantization noise into a higher frequency domain and the PLL circuit has a low-pass response for filtering out the quantization noise.

49. The circuit of claim 44, wherein the control circuit further includes a digital waveform generator configured to generate the waveform signal having the triangular wave profile in response to the reference clock signal.

50. A circuit, comprising:
   a delay chain circuit having an input configured to receive a reference clock signal, the delay chain circuit including a plurality of delay elements coupled in series, wherein the delay chain circuit outputs a plurality of phase-shifted clock signals;
   a first multiplexer circuit having inputs coupled to receive the plurality of phase-shifted clock signals and having a first selection input configured to receive a first selection signal which selects one of the plurality of phase-shifted clock signals for output; and
   a control circuit configured to generate values for the first selection signal from a waveform signal having a periodic triangular wave profile, wherein the control circuit includes:
      a sigma-delta modulator configured to convert the waveform signal to generate a modulated digital signal from which the values for the first selection signal are generated;
   a compensation circuit configured to determine a number of delay elements within the delay chain circuit which change state in response to one cycle of the reference clock signal; and
   wherein the control circuit adjusts a number of quantization levels for the sigma-delta modulator in response to the determined number of delay elements.

51. The circuit of claim 50, further comprising a phase generator circuit configured to process the modulated digital signal and output the values of the first selection signal.

52. The circuit of claim 51, wherein the phase generator circuit comprises a digital integrator circuit.

53. The circuit of claim 50, further comprising a phase lock loop (PLL) circuit configured to receive the selected phase-shifted clock signal as a reference for generating a spread spectrum clock signal.

54. The circuit of claim 53, wherein the sigma-delta modulator implements noise shaping to push quantization noise into a higher frequency domain and the PLL circuit has a low-pass response for filtering out the quantization noise.

55. The circuit of claim 54, wherein the control circuit further includes a digital waveform generator configured to generate the waveform signal having the triangular wave profile in response to the reference clock signal.

56. A circuit, comprising:
   a delay chain circuit having an input configured to receive a reference clock signal, the delay chain circuit including a plurality of delay elements coupled in series, wherein the delay chain circuit outputs a plurality of phase-shifted clock signals;
   a first multiplexer circuit having inputs coupled to receive the plurality of phase-shifted clock signals and having a first selection input configured to receive a first selection signal which selects one of the plurality of phase-shifted clock signals for output; and
   a control circuit configured to generate values for the first selection signal from a waveform signal having a periodic triangular wave profile, wherein the triangular wave profile is defined by a modulation frequency and a modulation depth;
   wherein the control circuit includes:
      a sigma-delta modulator configured to convert the waveform signal to generate a modulated digital signal from which the values for the first selection signal are generated; and
   wherein the modulation depth is scaled by a compensation value to account for process and voltage variation of the plurality of delay elements.

57. The circuit of claim 56, wherein the control circuit further includes a digital waveform generator configured to generate the waveform signal having the triangular wave profile in response to the reference clock signal.

58. The circuit of claim 56, wherein the compensation value is generated dependent on a number of delay elements within the delay chain circuit which change state in response to one cycle of the reference clock signal.

59. A method, comprising:
   selecting one of a plurality of phase-shifted clock signals for output in response to a selection signal;
   generating values for the selection signal by performing sigma-delta modulation of a waveform signal having a periodic triangular wave profile;
   processing the selecting one of the plurality of phase-shifted clock signals to output a spread spectrum clock signal;
   determining a number of delay elements within a delay chain circuit generating the plurality of phase-shifted clock signals from a reference clock signal which change state in response to one cycle of the reference clock signal; and
   adjusting a modulation depth of the waveform signal having the triangular wave profile in response to the determined number of delay elements.

60. The method of claim 59, wherein the sigma-delta modulation generates a modulated digital signal, further comprising: phase processing the modulated digital signal to generate the values of the selection signal.

61. The method of claim 60, wherein phase processing comprises digitally integrating the modulated digital signal.

62. The method of claim 59, wherein processing comprises using the selected one of the plurality of phase-shifted clock signals as a reference clock for a phase lock loop (PLL) circuit which generates the spread spectrum clock signal.

63. The method of claim 62, wherein sigma-delta modulation implements noise shaping to push quantization noise into a higher frequency domain and wherein the PLL circuit has a low-pass response for filtering out the quantization noise.

64. A method, comprising:
selecting one of a plurality of phase-shifted clock signals for output in response to a selection signal;
generating values for the selection signal by performing sigma-delta modulation of a waveform signal having a periodic triangular wave profile;
processing the selecting one of the plurality of phase-shifted clock signals to output a spread spectrum clock signal;
determining a number of delay elements within a delay chain circuit generating the plurality of phase-shifted clock signals from a reference clock signal which change state in response to one cycle of the reference clock signal; and
adjusting a number of quantization levels for the sigma-delta modulation in response to the determined number of delay elements.

65. The method of claim 64, wherein the sigma-delta modulation generates a modulated digital signal, further comprising: phase processing the modulated digital signal to generate the values of the selection signal.

66. The method of claim 65, wherein phase processing comprises digitally integrating the modulated digital signal.

67. The method of claim 64, wherein processing comprises using the selected one of the plurality of phase-shifted clock signals as a reference clock for a phase lock loop (PLL) circuit which generates the spread spectrum clock signal.

68. The method of claim 67, wherein sigma-delta modulation implements noise shaping to push quantization noise into a higher frequency domain and wherein the PLL circuit has a low-pass response for filtering out the quantization noise.

69. A method, comprising:
selecting one of a plurality of phase-shifted clock signals for output in response to a selection signal;
generating values for the selection signal by performing sigma-delta modulation of a waveform signal having a periodic triangular wave profile;
processing the selecting one of the plurality of phase-shifted clock signals to output a spread spectrum clock signal; and
scaling a modulation depth of the waveform signal by a compensation value to account for process and voltage variation of delay elements within a delay chain circuit generating the plurality of phase-shifted clock signals.

70. A method, comprising:
selecting one of a plurality of phase-shifted clock signals for output in response to a selection signal;
generating values for the selection signal by performing sigma-delta modulation of a waveform signal having a periodic triangular wave profile;
processing the selecting one of the plurality of phase-shifted clock signals to output a spread spectrum clock signal; and
adjusting a number of quantization levels for the sigma-delta modulation to account for said process and voltage variation of delay elements within the delay chain circuit.

* * * * *